(12) United States Patent
Nakamura et al.

(10) Patent No.: US 8,337,655 B2
(45) Date of Patent: Dec. 25, 2012

(54) PROCESS FOR PRODUCING MULTILAYER PRINTED WIRING BOARD

(75) Inventors: Shigeo Nakamura, Kanagawa (JP); Seiichiro Ohashi, Kanagawa (JP); Eiichi Hayashi, Kanagawa (JP); Tadahiko Yokota, Kanagawa (JP)

(73) Assignee: Ajinomoto Co., Inc., Tokyo (JP)

( * ) Notice: Subject to any disclaimer, the term of this patent is extended or adjusted under 35 U.S.C. 154(b) by 0 days.

(21) Appl. No.: 12/721,891

(22) Filed: Mar. 11, 2010

(65) Prior Publication Data

US 2010/0206471 A1    Aug. 19, 2010

Related U.S. Application Data

(63) Continuation of application No. PCT/JP2008/066374, filed on Sep. 11, 2008.

(30) Foreign Application Priority Data

Sep. 11, 2007   (JP) .................. 2007-235621
Sep. 14, 2007   (JP) .................. 2007-239671

(51) Int. Cl.
    *B32B 38/10* (2006.01)
(52) U.S. Cl. ......... 156/247; 156/230; 156/250; 156/312
(58) Field of Classification Search .................. 156/230, 156/247, 250, 312
    See application file for complete search history.

(56) References Cited

U.S. PATENT DOCUMENTS

| | | | |
|---|---|---|---|
| 6,739,040 B1 | 5/2004 | Nakamura et al. | |
| 2002/0187353 A1* | 12/2002 | Nakamura et al. | 428/416 |
| 2004/0261941 A1 | 12/2004 | Nakamura et al. | |

(Continued)

FOREIGN PATENT DOCUMENTS

CN        1293218        5/2001

(Continued)

OTHER PUBLICATIONS

Office Action issued Sep. 18, 2012, in Japanese Patent Application No. 2009-532204 (with English Translation).

*Primary Examiner* — Khanh P Nguyen
*Assistant Examiner* — Margaret Squalls
(74) *Attorney, Agent, or Firm* — Oblon, Spivak, McClelland, Maier & Neustadt, L.L.P.

(57) ABSTRACT

A production method of a multi-layer printed wiring board containing the following steps (1)-(5):
(1) a temporary fitting preparatory step including conveying an adhesive sheet from an adhesive sheet roll wherein an adhesive sheet having a prepreg formed on a support film is wound in a roll and placing the adhesive sheet such that a prepreg surface contacts one or both of the surfaces of a circuit board,
(2) a temporary fitting step for temporarily fitting the adhesive sheet to the circuit board, including partially adhering the adhesive sheet to the circuit board by heating and pressing a part of the adhesive sheet from the support film side, and cutting the adhesive sheet according to the size of the circuit board with a cutter,
(3) a laminating step including heating and pressing the temporarily fitted adhesive sheet under reduced pressure to laminate the adhesive sheet on the circuit board,
(4) a thermal curing step including forming an insulating layer by thermally curing the prepreg, and
(5) a detaching step including detaching the support film after the thermal curing step,
enables continuous production of an insulating layer of a multi-layer printed wiring board with a prepreg and without using a single wafer.

13 Claims, 1 Drawing Sheet

U.S. PATENT DOCUMENTS

| | | |
|---|---|---|
| 2005/0008868 A1 | 1/2005 | Nakamura et al. |
| 2007/0095471 A1 * | 5/2007 | Ito et al. .................. 156/293 |
| 2009/0126974 A1 | 5/2009 | Yuasa et al. |
| 2011/0120630 A1 | 5/2011 | Yuasa et al. |

FOREIGN PATENT DOCUMENTS

| | | |
|---|---|---|
| EP | 1 092 739 | 4/2001 |
| EP | 1768471 A1 * | 3/2007 |
| EP | 1839833 A1 * | 10/2007 |
| JP | 60-132327 | 9/1985 |
| JP | 10-200264 | 7/1998 |
| JP | 2000-228581 | 8/2000 |
| JP | 2001-156453 | 6/2001 |
| JP | 2001-196743 | 7/2001 |
| JP | 2002-171061 | 6/2002 |
| JP | 2003-332740 | 11/2003 |
| JP | 2003-340952 | 12/2003 |
| JP | 2004-273911 | 9/2004 |
| JP | 2005-154727 | 6/2005 |
| JP | 2005-340594 | 12/2005 |
| JP | 2006-28275 | 2/2006 |
| JP | 2006-93647 | 4/2006 |
| JP | 2007-95760 | 4/2007 |
| WO | 2007/040125 | 4/2007 |

* cited by examiner

FIG. 1

| | Energy | Pulse width | Shot number | SEM photograph | After desmearing |
|---|---|---|---|---|---|
| Example 4 | 1.2mJ | 4us | 3 | | |
| Example 5 | 2.0mJ | 4us | 2 | | |
| Example 6 | 3.0mJ | 28us | 1 | | |

FIG. 2

| | Energy | Pulse width | Shot number | SEM photograph | After desmearing |
|---|---|---|---|---|---|
| Comparative Example 3 | 0.42mJ | 4us | 3 | | |
| Comparative Example 4 | 0.42mJ | 28us | 3 | | |
| Comparative Example 5 | 1.0mJ | 4us | 3 | | |

PROCESS FOR PRODUCING MULTILAYER PRINTED WIRING BOARD

CROSS REFERENCES TO RELATED APPLICATIONS

This application is a continuation of International Patent Application No. PCT/JP2008/066374, filed on Sep. 11, 2008, and claims priority to Japanese Patent Application No. 2007-235621, filed on Sep. 11, 2007, and Japanese Patent Application No. 2007-239671, filed on Sep. 14, 2007, all of which are incorporated herein by reference in their entireties.

BACKGROUND OF THE INVENTION

1. Field of the Invention

The present invention relates to methods for producing a multi-layer printed wiring board, and particularly, methods of producing a multi-layer printed wiring board by a buildup method using a prepreg.

2. Discussion of the Background

Conventionally, when a prepreg is used for forming an insulating layer of a multi-layer printed wiring board, it is a general practice to layer a prepreg on an inner layer circuit board, and pressurize and heat with a hot press or a vacuum laminating machine one by one. For example, JPA-2003-332740 discloses a method of forming an insulating layer on a circuit board one by one by treating a glass cloth prepreg and a copper foil with a vacuum pressing-type laminating machine. However, in view of the recent preference toward downsized and thinner electronic devices, there is an increasing demand for ultrafine wiring also in a printed wiring board having a multi-layer structure. To meet the need, it is advantageous to form a conductive layer by plating according to a semi-additive method rather than forming a conductive layer with a copper foil. In addition, formation of an insulating layer one by one cannot be said to be a satisfactory method also from the productivity. JP-A-2003-340952 discloses a method of producing a multi-layer printed wiring board using a stage B resin composition sheet with a release film, which is obtained by adhering by lamination of a sheet, wherein a stage B resin composition for additive is adhered to one surface of a release film, on a fiber cloth substrate. While this method enables formation of a conductive layer by plating, a vacuum press apparatus is used for forming an insulating layer and an insulating layer is also formed one by one. Thus, it cannot be said to be a satisfactory method from the productivity. A production method of an insulating layer of a multi-layer printed wiring board using a prepreg, which enables formation of a conductive layer by a semi-additive method without forming the layer one by one has not been put to practical use.

SUMMARY OF THE INVENTION

Accordingly, it is one object of the present invention to provide a method of producing a multi-layer printed wiring board that enables continuous production of an insulating layer of a multi-layer printed wiring board with a prepreg and without forming one by one.

As a production technique of a multi-layer printed wiring board, a production method based on a buildup method, which includes alternately superimposing an insulating layer and a conductive layer, is known. Moreover, as a method of forming an insulating layer of a multi-layer printed wiring board, a method including continuously forming an insulating layer from an adhesive film, which has a thermosetting resin layer formed on a support film, using an autocutter and a vacuum laminating machine is known. Since the method uses an adhesive film rather than a prepreg, continuous production is possible without forming one by one. Generally, according to this method, first in an auto cutter, an adhesive film wound in a roll is conveyed onto a circuit board and, after partial thermal compression bonding of the adhesive film, cut according to the size of a circuit board, and the adhesive film is temporary fitted to the circuit board. Thereafter, the adhesive film is laminated on the circuit board by a vacuum laminating machine, a support film is detached, and an insulating layer is formed by thermal curing. After forming the insulating layer, a conductive layer can be formed by plating according to a semi-additive method.

As mentioned above, however, a production technique of a multi-layer printed wiring board also varies for a prepreg having mechanical properties and the like, which are greatly different from those of an adhesive film, and formation of an insulating layer one by one is generally employed. As pointed out in JP-A-2003-332740, moreover, prepregs were generally assumed for use in methods wherein a prepreg is sandwiched between mirror panels and adhered by heating and pressuring to form a multilayer. Therefore, when conventional prepregs are applied to a vacuum laminating machine, flowability sufficient to cover circuit concaves and convexes on an inner layer circuit board cannot be afforded. On the other hand, when flowability of a resin composition used for impregnating a prepreg is secured so that the circuit concaves and convexes can be sufficiently covered, the flowability of the resin becomes too high during a thermal curing step after vacuum lamination, which causes exuding of resin, exposure of fiber substances such as glass cloth and the like on the surface of an insulating layer, and the like, thus interfering with the formation of the insulating layer. Accordingly, it is difficult to apply a prepreg to the above-mentioned method wherein a laminating step is separated from a curing step. For example, JP-A-2005-154727 discloses a thermosetting resin composition having a molten viscosity suitable for formation of an insulating layer of a multi-layer printed wiring board by a vacuum laminating machine and a prepreg to be impregnated therewith. The prepreg is described to be also produceable by, in the same manner as with an adhesive film, laminating on a circuit board by a vacuum laminating method and curing by heating. In the Examples, eventually, a multi-layer printed wiring board was produced one by one only by a method including vacuum lamination press via a release film.

In view of such situation, the present inventors have made intensive studies and found that, when an insulating layer is formed by laminating an adhesive sheet, wherein a prepreg is formed on a support film, on a circuit board, and thermal curing the prepreg without detaching the support film, an insulating layer can be formed without exuding of a resin from the prepreg in a thermal curing step even when the prepreg comprises a thermosetting resin composition having flowability sufficient to cover circuit concaves and convexes.

On the other hand, when the prepreg is thermally cured without detaching the support film, the support film cannot be detached easily after curing. Thus, it is necessary to use a support film with a release layer to enable detachment of the prepreg (insulating layer) after curing from the support film via the release layer. When a release layer is provided, a phenomenon was found during the study of the present inventors in which a support film was detached from a prepreg in an auto cutter in the process of conveying the adhesive sheet, thus making continuous production difficult to perform. Thus, the present inventors have further conducted intensive studies and found that, in a support film with a release layer, which enables detachment of the support film even after curing from the cured prepreg, stable continuous production is possible by setting the peel strength of the support film from the prepreg before thermal curing to not less than a predetermined level.

The present inventors have completed the present invention based on the findings as mentioned above. Therefore, the present invention provides the following.

(1) A method of producing a multi-layer printed wiring board comprising:

(a) a temporary fitting preparatory step comprising conveying an adhesive sheet from an adhesive sheet roll wherein an adhesive sheet having a prepreg formed on a support film is wound in a roll and placing the adhesive sheet such that a prepreg surface contacts one or both of the surfaces of a circuit board;

(b) a temporary fitting step for temporarily fitting the adhesive sheet to the circuit board, comprising partially adhering the adhesive sheet to the circuit board by heating and pressing a part of the adhesive sheet from the support film side, and cutting the adhesive sheet according to the size of the circuit board with a cutter;

(c) a laminating step comprising heating and pressing the temporarily fitted adhesive sheet under reduced pressure to laminate the adhesive sheet on the circuit board;

(d) a thermal curing step comprising forming an insulating layer by thermally curing the prepreg; and (e) a detaching step comprising detaching the support film after the thermal curing step.

(2) The method of the above-mentioned (1), wherein, in the adhesive sheet, the support film has a release layer on the surface side in contact with the prepreg, and the peel strength of the support film from the prepreg before thermal curing is not less than 1.5 gf/50 mm at 180-degree peel strength.

(3) The method of the above-mentioned (1) or (2), wherein, in the adhesive sheet, the support film has a thickness of 20 to 50 μm and the prepreg has a thickness of 20 to 100 μm.

(4) The method of any of the above-mentioned (1) to (3), wherein the temporary fitting preparatory step and the temporary fitting step are performed by an auto cutter.

(5) The method of any of the above-mentioned (1) to (4), wherein the laminating step is performed by a vacuum laminating machine.

(6) The method of any of the above-mentioned (1) to (5), wherein the adhesive sheet has a layer constitution of protection film/prepreg/support film, and the protection film is detached by winding during conveying of the adhesive sheet in the temporary fitting preparatory step.

(7) The method of the above-mentioned (6), wherein, in the adhesive sheet, the protection film has a thickness of 5 to 30 μm.

(8) The method of any of the above-mentioned (1) to (7), wherein the heating and pressing are performed via an elastic material in the laminating step.

(9) The method of the above-mentioned (8), further comprising, after the laminating step, a smoothing step of heating and pressing the adhesive sheet under normal pressure with a metal plate.

(10) The method of any of the above-mentioned (1) to (9), further comprising a drilling step for drilling the insulating layer, a roughening step for roughening the insulating layer, a plating step for forming a conductive layer on the roughened insulating layer surface by plating, and a circuit forming step for forming a circuit on a conductive layer.

(11) The method of any of the above-mentioned (1) to (10), wherein the drilling step is performed between the thermal curing step and the detaching step.

(12) The method of the above-mentioned (10) or (11), wherein the drilling step comprises forming a via hole by applying a carbon dioxide gas laser on the top of the support film.

(13) The method of the above-mentioned (12), wherein the carbon dioxide gas laser has an energy of not less than 1 mJ.

(14) The method of the above-mentioned (12), wherein the energy of the carbon dioxide gas laser is 1 mJ to 5 mJ.

(15) The method of any of the above-mentioned (1) to (14), wherein the support film is a poly(ethylene terephthalate) film.

(16) The method of any of the above-mentioned (1) to (15), wherein the prepreg comprises a glass cloth impregnated with a thermosetting resin composition.

The production method of the present invention can continuously produce an insulating layer of a multi-layer printed wiring board with a prepreg without forming one by one. In other words, even when an insulating layer is formed by lamination of an adhesive sheet by a vacuum laminating machine and thermal curing, inconveniences such as exposure of prepreg fiber due to exuding of resin and the like do not occur, and an insulating layer superior in covering circuit concaves and convexes can be formed. In addition, an adhesive sheet wherein a prepreg is formed on a support film can be used as being wound in a roll in an auto cutter and the like, and can be temporarily fit to a circuit board continuously without detachment of the support film from the prepreg during conveying. Furthermore, by combining with a step of forming a conductive layer by plating according to a semi-additive method and the like, a built-up format using a prepreg becomes available, and a production method of a printed wiring board having high productivity can be provided.

Since an insulating layer formed from a prepreg is superior in the mechanical strength, the present invention is particularly useful for the production of a thin multi-layer printed wiring board such as a thin core substrate, a coreless substrate omitting a core substrate, and the like.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

The present invention is explained in the following by referring to a preferable embodiment thereof.

The prepreg of the present invention can be obtained by impregnating a sheet fiber substrate with a thermosetting resin composition, followed by heating and drying.

As the sheet fiber substrate, those conventionally used as a substrate for prepreg such as glass cloth, aramid non-woven fabric, liquid crystal polymer non-woven fabric and the like can be used. Glass cloth is particularly preferable. In addition, when used for forming an insulating layer of a multi-layer printed wiring board, a thin-type substrate having a thickness of not more than 50 μm is preferably used.

As specific examples of the sheet fiber substrate, a glass cloth substrate includes STYLE1027MS (warp yarn density 75 yarns/25 mm, weft yarn density 75 yarns/25 mm, cloth weight 20 g/m$^2$, thickness 19 μm) and 1037MS (warp yarn density 70 yarns/25 mm, weft yarn density 73 yarns/25 mm, cloth weight 24 g/m$^2$, thickness 28 μm) manufactured by Asahi-Schwebel Co., Ltd., and 1037NS (warp yarn density 72 yarns/25 mm, weft yarn density 69 yarns/25 mm, cloth weight 23 g/m$^2$, thickness 21 μm), 1027NS (warp yarn density 75 yarns/25 mm, weft yarn density 75 yarns/25 mm, cloth weight 19.5 g/m$^2$, thickness 16 μm), and 1015NS (warp yarn density 95 yarns/25 mm, weft yarn density 95 yarns/25 mm, cloth weight 17.5 g/m$^2$, thickness 15 μm) manufactured by Arisawa Mfg. Co., Ltd. and the like.

Examples of the liquid crystal polymer non-woven fabric include VECLS (fabric weight 6 to 15 g/m$^2$), Vectran and the like made from an aromatic polyester non-woven fabric by a melt-blow method (manufactured by Kuraray Co., Ltd.).

As the thermosetting resin composition, any can be used without any particular limitation as long as it is suitable for the insulating layer of a multilayer printed wiring board. For example, a composition containing at least a thermosetting resin such as epoxy resin, cyanate ester resin, phenol resin, bismaleimide-triazine resin, polyimide resin, acrylic resin, vinylbenzyl resin, and the like and a curing agent thereof can be used. Preferred is a composition containing an epoxy resin as a thermosetting resin, for example, a composition containing an epoxy resin, a thermoplastic resin, and a curing agent.

Examples of the epoxy resin include a bisphenol A type epoxy resin, biphenyl type epoxy resin, naphthol type epoxy resin, naphthalene type epoxy resin, bisphenol F type epoxy resin, phosphorus containing epoxy resin, bisphenol S type epoxy resin, alicyclic epoxy resin, aliphatic chain epoxy resin, phenol novolac type epoxy resin, cresol novolac type epoxy resin, bisphenol A novolac type epoxy resin, epoxy resin having butadiene structure, diglycidyl etherified product of bisphenol, diglycidyl etherified product of naphthalenediol, glycidyl etherified product of phenols, and diglycidyl etherified product of alcohols, and an alkyl substituted product, halide and hydrogenated product of these epoxy resins, and the like. Any one kind of these epoxy resins may be used alone or two or more kinds thereof may be mixed.

As the epoxy resin, bisphenol A type epoxy resin, naphthol type epoxy resin, naphthalene type epoxy resin, biphenyl type epoxy resin and epoxy resin having butadiene structure are preferable, from the aspects of heat resistance, insulation reliability and close adhesion to metal films. Specifically, for example, liquid bisphenol A type epoxy resin ("Epikote 828EL" manufactured by Japan Epoxy Resins Co., Ltd.), naphthalene type bifunctional epoxy resin ("HP4032", "HP4032D" manufactured by DIC Corporation), naphthalene type tetrafunctional epoxy resin ("HP4700" manufactured by DIC Corporation), naphthol type epoxy resin ("ESN-475V" manufactured by Tohto Kasei Co., Ltd.), epoxy resin having a butadiene structure ("PB-3600" manufactured by DAICEL CHEMICAL INDUSTRIES, LTD.), epoxy resin having a biphenyl structure ("NC3000H", "NC3000L" manufactured by Nippon Kayaku Co., Ltd., "YX4000" manufactured by Japan Epoxy Resins Co., Ltd.) and the like can be mentioned.

A thermoplastic resin is added for the purpose of imparting suitable flexibility to a composition after curing and the like and, for example, phenoxy resin, polyvinyl acetal resin, polyimide, polyamideimide, polyethersulfone, polysulfone and the like can be mentioned. Any one kind of these thermoplastic resins may be used alone or two or more kinds thereof may be mixed. The thermoplastic resin is preferably added in a proportion of 0.5 to 60 mass %, more preferably 3 to 50 mass %, relative to a nonvolatile component in the thermosetting resin composition as 100 mass %.

Specific examples of the phenoxy resin include FX280, FX293 manufactured by Tohto Kasei Co., Ltd., YX8100, YL6954, YL6974 manufactured by Japan Epoxy Resins Co., Ltd. and the like.

The polyvinyl acetal resin is preferably polyvinyl butyral resin. Specific examples of the polyvinyl acetal resin include Denka Butyral 4000-2, 5000-A, 6000-C, 6000-EP manufactured by DENKI KAGAKU KOGYO KABUSHIKI KAISHA, S-LEC BH series, BX series, KS series, BL series, BM series manufactured by SEKISUI CHEMICAL CO., LTD. and the like.

Specific examples of the polyimide include polyimide "RIKACOAT SN20" and "RIKACOAT PN20" manufactured by New Japan Chemical Co., Ltd. Moreover, linear polyimide obtained by reacting a bifunctional hydroxyl group-terminated polybutadiene, a diisocyanate compound and tetrabasic acid anhydride (one described in JP-A-2006-37083), modified polyimide such as polyimide having a polysiloxane skeleton (those described in JP-A-2002-12667, JP-A-2000-319386 etc.) and the like can be mentioned.

Specific examples of the polyamideimide include polyamideimide "VYLOMAX HR11NN", and "VYLOMAX HR16NN" manufactured by Toyobo Co., Ltd. In addition, examples thereof include modified polyamideimide such as polysiloxane skeleton-containing polyamideimides "KS9100" and "KS9300" manufactured by Hitachi Chemical Co., Ltd and the like.

Specific examples of the polyethersulfone include polyethersulfone "PES5003P" manufactured by Sumitomo Chemical Co., Ltd. and the like.

Specific examples of the polysulfone include polysulfone "P1700", "P3500" manufactured by Solvay Advanced Polymers K.K and the like.

Examples of the curing agent include amine series curing agents, guanidine series curing agents, imidazole series curing agents, phenol series curing agents, naphthol series curing agents, acid anhydride series curing agents, epoxy adducts thereof, microencapsulated products thereof, cyanate ester resins and the like. Of these, phenol series curing agents, naphthol series curing agents and cyanate ester resins are preferable. In the present invention, the curing agent may be used alone or in a combination of two or more kinds.

Specific examples of the phenol series curing agents and naphthol series curing agents include MEH-7700, MEH-7810, MEH-7851 (manufactured by Meiwa Plastic Industries, Ltd), NHN, CBN, GPH (manufactured by Nippon Kayaku Co., Ltd.), SN170, SN180, SN190, SN475, SN485, SN495, SN375, SN395 (manufactured by Tohto Kasei Co., Ltd.), LA7052, LA7054, LA3018, LA1356 (manufactured by DIC Corporation) and the like.

In addition, specific examples of the cyanate ester resin include bifunctional cyanate resins such as bisphenol A dicyanate, polyphenol cyanate(oligo(3-methylene-1,5-phenylene cyanate), 4,4'-methylenebis(2,6-dimethylphenyl cyanate), 4,4'-ethylidenediphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl) methane, 1,3-bis(4-cyanatephenyl)-1-(methylethylidene)) benzene, bis(4-cyanatephenyl)thioether, bis(4-cyanatephenyl)ether and the like, multifunctional cyanate resins derivatized from phenol novolac, cresol novolac and the like, prepolymers wherein these cyanate resins are partly converted into triazine and the like. Examples of the commercially available cyanate ester resin include phenol novolac type multifunctional cyanate ester resin ("PT30" manufactured by Lonza Japan Ltd., cyanate equivalent 124), prepolymer wherein bisphenol A dicyanate is partly or entirely triazined into a trimer ("BA230" manufactured by Lonza Japan Ltd., cyanate equivalent 232) and the like.

The mixing ratio of the thermosetting resin and the curing agent is appropriately determined according to the kinds of the thermosetting resin and the curing agent and the like. When the thermosetting resin is an epoxy resin, for example, the mixing ratio of the epoxy resin and the curing agent in the case of phenol series curing agent or naphthol series curing agent is preferably a ratio of phenolic hydroxyl group equivalent of the curing agent of within the range of 0.4 to 2.0, more preferably within the range of 0.5 to 1.0, relative to 1 epoxy equivalent of the epoxy resin. In the case of a cyanate ester resin, the ratio of a cyanate equivalent is preferably within the range of 0.3 to 3.3, more preferably 0.5 to 2, relative to 1 epoxy equivalent, is preferable.

The thermosetting resin composition can further contain, in addition to a curing agent, a curing accelerator. Examples of such curing accelerators include imidazole series compounds, organic phosphine series compounds and the like, and specific examples include 2-methylimidazole, triphenylphosphine, and the like. When a curing accelerator is used, it is preferably used in a proportion of 0.1 to 3.0 mass % relative to the epoxy resin. When a cyanate ester resin is used as the epoxy resin curing agent, an organic metal compound conventionally used as a curing catalyst in a system using an epoxy resin composition and a cyanate compound in combination may be added to shorten the curing time. The organic metal compound includes organic copper compounds such as copper(II) acetylacetonate and the like, organic zinc compounds such as zinc(II) acetylacetonate and the like, organic cobalt compounds such as cobalt(II) acetylacetonate, cobalt (III) acetylacetonate and the like, and the like. The amount of the organic metal compound to be added is generally within the range of 10 to 500 ppm, preferably 25 to 200 ppm, based on the metal, relative to the cyanate ester resin.

The thermosetting resin composition may contain an inorganic filler for low thermal expansion of the composition after curing. Examples of the inorganic filler include silica, alumina, isinglass, mica, silicate, barium sulfate, magnesium hydroxide, titanium oxide, and the like. Silica and alumina are preferable, and silica is particularly preferable. From the aspect of insulation reliability, the inorganic filler preferably has an average particle size of not more than 3 µm, more preferably not more than 1.5 µm. The content of the inorganic filler in the thermosetting resin composition is preferably 20 to 60 mass %, more preferably 20 to 50 mass %, when the nonvolatile component of the thermosetting resin composition is 100 mass %.

The thermosetting resin composition can contain other components where necessary. Examples of other components include flame retardants such as an organic phosphorus series flame retardant, an organic nitrogen-containing phosphorus compound, a nitrogen compound, a silicone series flame retardant, a metal hydroxide, and the like, organic fillers such as a silicone powder, a nylon powder, a fluorine powder, and the like, thickeners such as ORBEN, BENTON, and the like, silicone series, fluorine series, polymer series antifoaming agents and leveling agents, close adhesion imparting agents such as imidazole series, thiazole series, triazole series, silane series coupling agents and the like, colorants such as phthalocyanine blue, phthalocyanine green, iodine green, disazo yellow, carbon black etc. and the like.

The prepreg can be produced by a known hot-melt method, a solvent method, and the like. According to the hot-melt method, a prepreg is produced by once coating, without dissolving a resin composition in an organic solvent, a resin composition to a releasing paper showing good release property from a resin composition and laminating the same on a sheet-like fiber substrate, or directly coating the same with a die coater and the like. According to the solvent method, a sheet-like fiber substrate is immersed in a resin composition varnish obtained by dissolving a resin composition in an organic solvent to allow the sheet-like fiber substrate to be impregnated with the resin composition varnish, and dried thereafter. It is also possible to prepare a prepreg by continuously thermal laminating adhesive films comprised of a thermosetting resin composition, which are laminated on a support film, under the conditions of heating and pressing from both surfaces of a sheet-like fiber substrate. Examples of the organic solvent used for preparing varnish include ketones such as acetone, methylethyl ketone, cyclohexanone, and the like, acetic acid esters such as ethyl acetate, butyl acetate, cellosolve acetate, propylene glycol monomethylether acetate, carbitol acetate, and the like, carbitols such as cellosolve, butyl carbitol, and the like, aromatic hydrocarbons such as toluene, xylene, and the like, dimethylformamide, dimethylacetamide, N-methylpyrrolidone, and the like. Such organic solvent may be used alone or in a combination of two or more kinds.

While the drying conditions are not particularly limited, when a prepreg is laminated on a circuit board and the like, it is important to prevent progress of curing of a thermosetting resin composition as far as possible during drying so that the adhesion ability of the prepreg can be retained. In addition, since a large amount of an organic solvent remaining in a prepreg causes development of swelling after curing, the prepreg is dried such that the content ratio of the organic solvent in a thermosetting resin composition is generally not more than 5 mass %, preferably not more than 2 mass %. While specific drying conditions vary depending on the curability of a thermosetting resin composition and the amount of an organic solvent in varnish, for example, a varnish containing 30 to 60 mass % of an organic solvent can be generally dried at 80 to 180° C. for about 3 to 13 minutes. Those of ordinary skill in the art can appropriately set preferable drying conditions by a simple experiment.

Examples of the preparation method of the adhesive sheet, wherein a prepreg is formed on a support film, of the present invention include a method comprising conveying a prepreg and a support to a roll type laminating apparatus, and continuously pressing and heating the support film to the prepreg by a metal roll or elastic material roll to give a laminate. In addition, when an adhesive sheet having a protection film is prepared, a method comprising conveying a prepreg, a support and a protection film to a roll type laminating apparatus such that the support film contacts one surface of the prepreg and the protection film contacts another surface, and pressing and heating with a metal roll or an elastic material roll from the surfaces of both the support film and the protection film to give a laminate can be mentioned. A roll-like adhesive sheet is prepared by winding the obtained adhesive sheet after the lamination. In addition, these adhesive sheets can be efficiently produced by continuous preparation after the production step of a prepreg. For example, a sheet-like fiber substrate wound in a roll is continuously conveyed by being rolled, immersed in a varnish of a thermosetting resin composition and dried, and can be directly subjected to a preparation step of an adhesive sheet.

As the support film, a plastic film is preferably used. Examples of the plastic film include polyesters such as poly (ethylene terephthalate) (hereinafter to be sometimes abbreviated as "PET"), poly(ethylene naphthalate) (hereinafter to be sometimes abbreviated as "PEN"), and the like, polycarbonate (hereinafter to be sometimes abbreviated as "PC"), acrylic (PMMA), cyclic polyolefin, triacetyl cellulose (TAC), polyether sulfide (PES), polyether ketone, polyimide, and the like. Among these, a poly(ethylene terephthalate) film and a poly(ethylene naphthalate) film are preferable, and a low-cost poly(ethylene terephthalate) film is particularly preferable. The support film may be subjected to a mat treatment or a corona treatment of the surface on the prepreg side. To afford a support film which is detachable after thermal curing of a prepreg, as the support film, a support film with a release layer wherein the release layer is present on the side where the support film and the prepreg are contacted is preferably used.

When a support film with a release layer is used, the support film is easily detached (delamination) from a prepreg in an auto cutter during the process of conveying the adhesive sheet. When the detachment is developed, inconveniences occur since wrinkles are developed in the support film in a later lamination step, the prepreg contains a void and the like. To suppress such detachment, it is important that a support film should be detacheable after thermal curing of a prepreg, and the peel strength of the support film from the prepreg before thermal curing should be not less than 1.5 gf/50 mm in 180-degree peel strength. Such peel strength (180-degree peel strength) is more preferably not less than 1.6 gf/50 mm, further preferably not less than 1.7 gf/50 mm. The upper limit of such peel strength is not particularly set as long as a support film in the adhesive sheet is detachable after thermal curing of a prepreg. It is generally considered to fall within the range of not more than 5 gf/50 mm.

A release agent to be used for the release layer of a support film with a release layer is not particularly limited as long as the support film is detachable after thermal curing of the prepreg and the 180-degree peel strength of the support film before thermal curing of the prepreg is not less than 1.5 gf/50 mm. Preferable examples thereof include an alkyd resin series release agent and the like. The silicone series release agent widely used for the release layer is generally superior in the release property. When a release layer containing the same as a main component is used, it is difficult to achieve a peel strength of the support film before thermal curing of a prepreg of not less than 1.5 gf/50 mm in 180-degree peel strength. However, since release property of the silicone series release agent can be controlled by adding a cellulose derivative such as methylcellulose, ethylcellulose, acetylcellulose and the like, an alkyd resin and the like, a release layer having a 180-degree peel strength of the support film before thermal curing of a prepreg of not less than 1.5 gf/50 mm may be prepared by controlling such release property.

The thickness of the release layer of the support film with the release layer is generally about 0.01 to 1 µm, preferably 0.01 to 0.2 µm.

In the present invention, moreover, the support film with a release layer may be a commercially available product. For example, a PET film having a release layer containing an alkyd resin series release agent as a main component, such as SK-1, AL-5 and AL-7 manufactured by Lintec Corporation, and the like, can be mentioned.

The above-mentioned peel strength (i.e., peel strength between the support film and prepreg before thermal curing of prepreg) tends to increase as the thickness of the support film grows. However, when the thickness of the support film is too large, continuous production tends to be difficult since conveying of the film by vacuum adsorption in an auto cutter becomes difficult, and the like. When the thickness of the support film is too small, the peel strength tends to be too small, and continuous production tends to be difficult since a phenomenon of winding of a temporarily fit adhesive sheet in a roll (curling) occurs and the like. In the present invention, therefore, the thickness of the support film is preferably within the range of 20 to 50 µm, more preferably within the range of 20 to 45 µm, particularly preferably within the range of 23 to 40 µm. The thickness of the support film in the present invention includes that of a release layer when a support has the release layer.

The peel strength (180-degree peel strength) between a support film and a prepreg before thermal curing of the prepreg can be measured according to the following method. An adhesive sheet is cut in a 50 mm width. When a protection film is present, the film is detached. Then, the prepreg side is adhered to a reinforced plate with a double-faced adhesive tape, and the peel strength on peeling the support film in the 180-degree direction is measured by a tensile tester. Examples of the tensile tester include Autograph AGS-J series manufactured by SHIMADZU CORPORATION and the like. As the peeling rate, for example, 200 mm/min is adopted.

In the present invention, the thickness of the prepreg is preferably 20 to 100 µm. When the thickness of the prepreg is less than 20 µm, a prepreg tends to be not laminated flatly on a circuit board. When the thickness exceeds 100 µm, a thin multi-layer printed wiring board cannot be obtained conveniently, and conveying of a film by vacuum adsorption in an auto cutter tends to be difficult.

The adhesive sheet in the present invention preferably has a protection film. In other words, the adhesive sheet preferably has a layer constitution of protection film/prepreg/support film. The protection film provides advantages such as protection of the prepreg surface from a physical damage when setting a prepreg with a support film in an auto cutter, prevention of attachment of foreign substance (dirt etc.) and the like. Examples of the protection film include polyolefin such as polyethylene, polypropylene, polyvinyl chloride, and the like, polyester such as PET, PEN, and the like, polycarbonate (PC), polyimide, and the like. Like a support film, a protection film may also be subjected to a mat treatment, a corona treatment as well as a release treatment. The thickness of the protection film is preferably within the range of 5 to 30 µm. When it is less than 5 µm, since the protection film is thin and easily extended, close adhesion to the prepreg surface tends to be difficult during production. When it exceeds 30 µm, the film is unpreferably disadvantageous in cost.

The temporary fitting preparatory step and the temporary fitting step in the present invention are explained as follows. In the temporary fitting preparatory step, a roll-like adhesive sheet slit in the width of a circuit board is first set in an auto cutter. For lamination on both surfaces of a circuit, two roll-like adhesive sheets are set on the upper and lower sides, and for lamination on one surface alone, one adhesive sheet is set. When the adhesive sheet has a protection film, the protection film is detached from a prepreg surface while taking up the film by a take-up roll. The adhesive sheet can be mechanically conveyed after fixing the adhesive sheet by vacuum adsorption from the support film side. The adhesive sheet is conveyed and configured such that the support film comes outside, namely, the prepreg surface comes into contact with one or both of the surfaces of the circuit board. In the temporary fitting step, for example, an adhesive sheet is partly adhered to a circuit board at an unnecessary part, which is a part of the front portion in the feeding direction of the substrate and not superimposed on a circuit in need of lamination, by heating and pressing the part of the adhesive sheet from the support film side. While the adhesion conditions vary depending on the thermosetting resin composition used for a prepreg and melt viscosity thereof, it is generally compression bonded at a temperature of 60 to 130° C. for about 1 to 10 sec. Thereafter, the adhesive sheet is conveyed with the circuit board, and cut according to the size of the substrate with a cutter, whereby the adhesive sheet is temporarily fit to the circuit board. During cutting, a cutter backup heater heated to 40 to 80° C. is preferably set to reduce generation of cutting scrap of the resin composition (resin chip).

The temporary fitting preparatory step and the temporary fitting step in the present invention can be successively performed using a commercially available auto cutter. Examples of the commercially available auto cutter include a dry film laminating machine Mach series manufactured by Hakuto Co., Ltd., auto cutters FAC-500 and SAC-500/600 manufactured by Shin-Ei Kiko Co., Ltd., and the like.

Then, a laminating step is explained. An adhesive sheet temporarily fit to a circuit board is heated and pressed under reduced pressure to laminate the adhesive sheet on the circuit board. The heating and pressing in the laminating step can be performed by pressing a heated metal plate such as SUS mirror plate and the like from the support film side. However, the metal plate is preferably pressed via an elastic material such as heat resistant rubber and the like, rather than direct pressing, so that the adhesive sheet will sufficiently follow circuit concaves and convexes of the circuit board. The pressing is performed in a temperature range of preferably 70 to 140° C. and pressure range of preferably 1 to 11 $kgf/cm^2$ ($9.8 \times 10^4$ to $107.9 \times 10^4$ $N/m^2$). The air pressure is preferably a reduced pressure of preferably not more than 20 mmHg (26.7 hPa). After the laminating step, the laminated adhesive sheet is smoothed preferably by a hot press with a metal plate. The smoothing step is performed by heating and pressing the adhesive sheet with a heated metal plate such as SUS mirror plate and the like under normal pressure (atmospheric pressure). The heating and pressing conditions are similar to those in the above-mentioned laminating step.

The laminating step and smoothing step in the present invention can be successively performed using a commercially available vacuum laminating machine. Examples of the commercially available vacuum laminating machine include vacuum pressing type laminating machine manufactured by MEIKI Co., Ltd., vacuum applicator manufactured by Nichigo-Morton Co., Ltd. and the like.

After the laminating step or after the smoothing step, a thermal curing step is performed. In the thermal curing step, a prepreg is thermally cured to form an insulating layer.

While the thermal curing conditions vary depending on the kind and the like of the thermosetting resin composition, the curing temperature is generally about 170 to 190° C., and curing time is about 15 to 60 minutes.

The production method of the multi-layer printed wiring board of the present invention further includes a step of detaching a support film from a thermally cured prepreg (insulating layer). The support film may be manually detached or mechanically detached by an automatic detaching apparatus.

The production method of the multi-layer printed wiring board of the present invention may further contain a drilling step for drilling an insulating layer, a roughening step for roughening an insulating layer, a plating step for forming a conductive layer on a roughened insulating layer surface by plating, and a circuit forming step for forming a circuit on a conductive layer. These steps can be performed according to various methods known to those of ordinary skill in the art and used for the production of multilayer printed wiring boards.

The drilling step can be performed, for example, by forming a hole such as via hole (blindvia), through-hole and the like in an insulating layer with a drill, laser such as carbon dioxide gas laser, YAG laser and the like, plasma and the like. The blindvia in a high density wiring is preferably formed by a laser. While UV-YAG laser shows fine processability on glass cloth, it is not necessarily satisfactory from the aspects of cost and processing speed. On the other hand, carbon dioxide gas laser is superior to UV-YAG laser in processing speed and cost; however, processability is not fine. For example, when blindvia and the like are formed by applying carbon dioxide gas laser to a prepreg, glass cloth protrudes from the blindvia side wall due to different processability between the glass cloth and the thermosetting resin, and the concave and convex of the wall surface increase. Such concave and convex of the side surface of a blindvia decreases conduction reliability, and causes a remarkable problem particularly in a high density printed wiring board having a pore size of not more than 100 μm. When the energy of carbon dioxide gas laser is increased to enhance processability of glass cloth, the insulating layer surface receives a greater damage, the size of the surface of the pore (diameter of via top) is processed to become large, and the concave and convex of the insulating layer surface near the pore increase, which is inconvenient for forming an ultrafine wiring. In contrast, when a blindvia (via hole) is formed by laminating an adhesive sheet, wherein a prepreg is formed on a support film, on a circuit board, thermal curing the prepreg without detaching the support film to form an insulating layer, and applying carbon dioxide gas laser of the support film, the damage on the insulating layer surface is suppressed, and the glass cloth is processed successfully even when carbon dioxide gas laser with high energy is applied. Therefore, a blindvia is preferably formed between the thermal curing step and the detaching step, and a blindvia is preferably formed by applying carbon dioxide gas laser on a support film after forming an insulating layer by thermally curing a prepreg. In addition, as a support film, a plastic film is preferable as mentioned above, and a poly(ethylene terephthalate) film is particularly preferable. When an insulating layer is formed using an adhesive layer free of a fiber substrate, such problem does not occur since it can be processed with a lower energy.

The carbon dioxide gas laser used generally has a wavelength of 9.3 to 10.6 μm. The energy of the carbon dioxide gas laser is preferably not less than 1 mJ. When the energy is too low, a fiber substrate protrudes from the pore side wall due to low processability of the fiber substrate, and the concave and convex of the wall surface tend to remarkably increase. In addition, increase of processing speed by decreasing the shot number also becomes difficult. Since a higher upper limit of the energy causes damage on underlying conductive layer of the blindvia, the upper limit is inevitably determined. Depending on the shot number, depth of blindvia and the like, it is generally not more than 5 mJ, preferably not more than 4.5 mJ, more preferably not more than 4 mJ, particularly preferably not more than 3.5 mJ.

While the shot number also varies depending on the depth of blindvia and pore size, it is generally 1 to 10 shots. To increase processing speed, a smaller shot number is preferable. Using a high energy value, a blindvia can be processed by 1 or 2 shots, and the productivity of a multi-layer printed wiring board can be strikingly improved. Thus, the energy of the carbon dioxide gas laser is more preferably not less than 1.5 mJ, further preferably not less than 2 mJ, from the aspect of processing speed. For processing with plural shots, since a burst mode employing continuous shots accumulates processing heat in the pore, a difference in the processability easily occurs between a fiber substrate and a thermosetting resin composition and concave and convex of the pore side wall tend to be large. Thus, a cycle mode employing plural shots with time intervals is preferable.

The pulse width of the carbon dioxide gas laser is not particularly limited, and can be selected from a wide range of from a middle range of 28 μs to a short pulse of about 4 μs.

The energy of carbon dioxide gas laser is an energy value of laser on an insulating layer surface per one shot, which can be adjusted based on the output of oscillator, collimation lens (lens for energy control), mask diameter and the like of a carbon dioxide gas laser apparatus. The mask diameter is selected according to the diameter of a blindvia to be processed. The energy value can be measured by placing a measurement device (power sensor) on a table on which laser processing is performed and measuring the energy at the height of the insulating layer surface of a circuit board to be processed. Commercially available carbon dioxide gas laser apparatuses are equipped with a measurement apparatus, and the energy on an irradiation target surface can be easily measured. Examples of the commercially available carbon dioxide gas laser apparatus include ML605GTWII manufactured by Mitsubishi Electric Corporation, LC-G series manufactured by Hitachi Via Mechanics, Ltd., substrate drilling laser processing machine manufactured by Matsushita Welding Systems Co., Ltd. and the like.

Where necessary, a through-hole may be formed in a circuit board having an insulating layer. A through-hole can be formed according to a conventionally-known method. In a multi-layer printed wiring board, a through-hole is generally formed in a core substrate, and a build-up insulating layer is generally conducted by a blindvia. In addition, a drilling machine is generally used for forming a through-hole. A method of forming a through-hole in a core substrate by laser is known. In this case, since a copper foil reflects laser, a method including chemically processing a copper foil surface and applying laser is generally employed. In addition, a method including setting a drilling aid sheet containing a component improving laser energy absorption on a copper foil surface and applying laser is also known. When a through-hole is formed by carbon dioxide gas laser, a greater energy is necessary and, for example, 10 to 60 mJ of energy is employed, though subject to change depending on the thickness of the copper foil and core substrate. In a thin circuit board, for example, like formation of a blindvia in the present invention, a through-hole may be formed by applying a laser on a built-up insulating layer, such as formation of a through-hole by applying a carbon dioxide gas laser on a support film closely adhered to the insulating layer surface and the like.

The production method of the multi-layer printed wiring board of the present invention further contains a detaching step including detaching a support film from a thermally cured prepreg (insulating layer). A support film may be detached manually or mechanically detached by an automatic detaching apparatus. A support film is preferably detached after formation of a blindvia. When a through-hole is formed, it is preferably formed after formation of a blindvia, or after formation of a blindvia and a through-hole.

A roughening step can be performed, for example, by treating an insulating layer surface with an oxidant such as an aqueous alkaline permanganate solution and the like. The roughening step sometimes acts as a desmear step of a hole such as via hole, through hole and the like. Prior to treatment with an aqueous alkaline permanganate solution, a swelling treatment with a swelling solution is preferably performed. Examples of the swelling solution include Swelling Dip Securiganth P and Swelling Dip Securiganth SBU manufactured by Atotech Japan K. K. and the like. The swelling treatment is generally performed by immersing an insulating layer in a swelling solution heated to about 60 to 80° C. for about 5 to 10 minutes. Examples of the aqueous alkaline permanganate solution include a solution obtained by is dissolving potassium permanganate or sodium permanganate in an aqueous solution of sodium hydroxide. A roughening treatment with an aqueous alkaline permanganate solution is generally performed at 60 to 80° C. for 10 to 30 minutes. As commercially available products of the aqueous alkaline permanganate solution, Concentrate Compact CP and Dosing Solution Securiganth P manufactured by Atotech Japan K. K. and the like can be mentioned. In addition, after a treatment with an oxidant (aqueous alkaline permanganate solution), a neutralization treatment with a reducing agent is preferably performed. Examples of the reducing agent (neutralization solution) include Reduction Solution Securiganth P manufactured by Atotech Japan K. K. The neutralization treatment is generally performed by immersing an insulating layer in a neutralization solution heated to about 25 to 60° C. for about 2 to 7 minutes.

A plating step is performed, for example, by forming a conductive layer on the surface of an insulating layer, which has convex and concave anchors formed by a roughening treatment, by a method combining electroless plating and electroplating. As the conductive layer, a copper plating layer is preferable. A copper plating layer is formed by a method combining electroless copper plating and copper electroplating, or a conductive layer is formed by forming a plating resist having a pattern reverse to the conductive layer and applying electroless copper plating alone. The thickness of the electroless plating layer is preferably 0.1 to 3 μm, more preferably 0.3 to 2 μm. As the thickness of the electroplating layer, the total thickness with the thickness of the electroless plating layer is preferably 3 to 35 μm, more preferably 5 to 20 μm. After formation of the conductive layer, an annealing treatment is performed at 150 to 200° C. for 20 to 90 minutes to further improve the peel strength of the conductive layer and stabilize the conductive layer.

For a circuit formation step, for example, subtractive process, semi-additive process and the like can be used. For fine line formation, a semi-additive process is preferable, wherein a pattern resist is applied onto an electroless plating layer, an electrolytic plating layer (pattern plating layer) having a desired thickness is formed, the pattern resist is detached and an electroless plating layer is removed by flash etching to give a circuit.

The circuit substrate to be used for the production of the multilayer printed wiring board of the present invention mainly refers to a glass epoxy substrate, a metal substrate, a polyester substrate, a polyimide substrate, a BT resin substrate, a thermosetting polyphenylene ether substrate, and the like, wherein one or both of the surfaces thereof have a pattern processed conductive layer (circuit). The circuit substrate in the present invention also encompasses an internal-layer circuit substrate of an intermediate product, on which an insulating layer and/or a conductive layer will be formed for the production of a multilayer printed wiring board. The surface of a conductive circuit layer is preferably roughened in advance by a blackening treatment and the like, since close adhesion of an insulating layer to a circuit substrate can be achieved.

Other features of the invention will become apparent in the course of the following descriptions of exemplary embodiments which are given for illustration of the invention and are not intended to be limiting thereof.

EXAMPLES

In the following Examples and Comparative Examples, "part" means "parts by mass".

Example 1

Liquid bisphenol A type epoxy resin (epoxy equivalents 180, "Epikote 828EL" manufactured by Japan Epoxy Resins Co., Ltd., 28 parts) and naphthalene type tetrafunctional epoxy resin (epoxy equivalents 163, "HP4700" manufactured by DIC Corporation, 28 parts) were dissolved in a mixed solution of methylethyl ketone (15 parts) and cyclohexanone (15 parts) with stirring while heating. Thereto were added a methylethyl ketone solution (110 parts) of a naphthol series curing agent ("SN-485" manufactured by Tohto Kasei Co., Ltd., phenolic hydroxyl group equivalents 215) having a solid content of 50%, a curing catalyst ("2E4MZ" manufactured by SHIKOKU CHEMICALS CORPORATION, 0.1 part), spherical silica (average particle size 0.5 µm, "SO-C2" manufactured by Admatechs Company Limited, 70 parts), and a polyvinyl butyral resin solution ("KS-1" manufactured by SEKISUI CHEMICAL CO., LTD., 30 parts, solid content 15%, 1:1 solution of ethanol:toluene), and the mixture was uniformly dispersed in a high-speed rotation mixer to give a thermosetting resin composition varnish.

A 19 µm-thick glass cloth (1027MS manufactured by Asahi-Schwebel Co., Ltd.) was impregnated with the varnish and dried at 80 to 120° C. for 6 minutes to give a 50 µm-thick prepreg (residual solvent amount was 1 wt % in the thermosetting resin composition without glass cloth). PET with 25 µm-thick release layer (AL5: alkyd resin series release agent manufactured by Lintec Corporation) described in Table 1 was thermally laminated on one side of a prepreg, and a 16 µm-thick polypropylene protection film was thermally laminated on the other side thereof and the laminate was wound in a roll. Thereafter, the roll was slit at width 335 mm to give two 50 m-long adhesive sheet rolls. Then, the rolls were set in an auto cutter FAC-500 manufactured by Shin-Ei Kiko Co., Ltd. and a temporary fitting test onto a 0.2 mm-thick copper-plated laminate plate with a circuit formed thereon (circuit conductor thickness 18 µm) was performed. The temporary fitting was performed at 100° C. for 3 seconds.

The sheet temporarily fit well was laminated on both surfaces of a laminate plate by a vacuum laminating machine manufactured by MEIKI Co., Ltd. under conditions of temperature 120° C., pressure 7 kgf/cm$^2$, pressure 5 mmHg or below and continuously subjected to a hot press with an SUS mirror panel under conditions of temperature 120° C., pressure 5 kgf/cm$^2$, atmospheric pressure. Then, the laminate with a PET film was thermally cured at 180° C. for 30 minutes to form an insulating layer on both surfaces of the substrate. Thereafter, the release property of the PET film was evaluated by manually detaching the film.

Measurement of Detaching Strength of Support Film and Prepreg (Before Thermal Curing).

The detaching strength between a support film and a prepreg was measured by cutting an adhesive sheet in a width of 50 mm, detaching a protection film, adhering the prepreg side to a reinforced plate with a double-faced adhesive tape, and measuring the peel strength on peeling the support film in a 180-degree direction by a tensile tester. The values in the Table are averages of 3 measurements. As the tensile tester, an Autograph AGS-500 manufactured by SHIMADZU CORPORATION was used, and the peeling speed was 200 mm/minute.

Example 2

By an operation in the same manner as in Example 1 except that PET with a 38 µm-thick release layer (AL5 manufactured by Lintec Corporation: alkyd resin series release agent) described in Table 1 was used, evaluation was performed in the same manner as in Example 1.

Comparative Example 1

By an operation in the same manner as in Example 1 except that PET with a 16 µm-thick release layer (A15 manufactured by Lintec Corporation: alkyd resin series release agent) described in Table 1 was used, evaluation was performed in the same manner as in Example 1.

TABLE 1

|  | Comparative Example 1 | Example 1 | Example 2 |
| --- | --- | --- | --- |
| thickness (µm) of support film | 16 | 25 | 38 |
| thickness (µm) of prepreg | 50 | 50 | 50 |
| detaching strength (gf/50 mm) between support film and prepreg | 0.9 | 1.7 | 2.3 |
| detachment (delamination) between support film and prepreg | x | o | o |
| curling of prepreg after temporary fitting | x | o | o |
| film delivery in auto cutter | o | o | o |
| detachment of support film after thermal curing | — | o | o |

In Table 1, the detaching strength (gf/50 mm) between a support film and a prepreg is that before thermal curing of the prepreg.

In Table 1, the detachment (delamination) between a support film and a prepreg was evaluated by visually observing whether the supporting film was detached in 1 cm of both ends of the long side of the adhesive sheet when the adhesive sheet wound in a roll was drawn out by about 1 m. An adhesive sheet free of detachment and delamination between a support film and a prepreg in all regions passed (o), and an adhesive sheet with detachment or delamination failed (x).

In addition, curling of a prepreg after temporary fitting was evaluated by drawing out an adhesive sheet wound in a roll, cutting the sheet in a 50 cm length, placing the sheet on a flat table with the supporting film facing upward, fixing the side of one tip onto the table, and measuring the length of the other side shortened by curling. When the shortened length (roll back amount) was 5 cm or blow, the adhesive sheet passed (o), and when it exceeds 5 cm, the adhesive sheet failed (x).

The film delivery in an auto cutter was evaluated by setting an adhesive sheet wound in a roll in "SAC-500 (auto cutter manufactured by Shin-Ei Kiko Co., Ltd.)", and visually observing whether the detachment (delamination) occurs on the entire surface between a support film and a prepreg in SAC-500 during the step of conveying the adhesive sheet delivered from the roll to the temporary fitting step via the auto cutter. An adhesive sheet free of detachment (no delamination) on the entire surface passed (o), and an adhesive sheet with detachment (with delamination) failed (x).

In addition, detachment of the support film after thermal curing was evaluated by passing a substrate with an adhesive sheet temporarily fit thereto through a vacuum laminating machine manufactured by MEIKI Co., Ltd. to laminate the adhesive sheet on the substrate, heating the substrate by "SPHH-101 (gear oven manufactured by ESPEC)" at 180° C. for 30 minutes to cure the adhesive sheet, and visually observing the state of the support film after curing. An adhesive sheet having the support film adhered to the prepreg surface after curing passed (o), and an adhesive sheet with detachment of the support film from the prepreg surface failed (x). The evaluation (−) of detachment of the support film after thermal curing in Comparative Example 1 means that the delamination was developed before curing and evaluation of the detachment of the support film after thermal curing was not possible.

Example 3

Production of Multi-Layer Printed Wiring Board

The substrate temporarily fit with a prepreg with a support film obtained in Example 2 was laminated on both surfaces by a vacuum laminating machine manufactured by MEIKI Co., Ltd. under the conditions of temperature 120° C., pressure 7 kgf/cm$^2$, pressure 5 mmHg or below, and continuously subjected to a hot press with an SUS mirror panel under conditions of temperature 120° C., pressure 5 kgf/cm$^2$. Then, the laminate with a release PET film was heated at 180° C. for 30 minutes to thermally cure the prepreg to form an insulating layer on both surfaces of the substrate. Thereafter, the release PET film was detached, and via hole was formed by laser drilling. For a surface treatment process of the insulating layer also serving as a desmear process, the following chemical solutions manufactured by Atotech Japan K.K. were used.
    oxidant "Concentrate Compact CP" (alkaline permanganate solution)
    reducing agent "Reduction solution Securiganth P-500"

The insulating layer was subjected to a surface treatment with an oxidant solution at 80° C. for 10 minutes. Then, the layer was subjected to a neutralization treatment with a reducing agent solution at 40° C. for 5 minutes. A catalyst for electroless copper plating was applied to the surface of the insulating layer, electroless plating and electroplating were performed, and the outermost copper layer was etched to form a circuit to give a 4 layer printed wiring board. Then, an annealing treatment was further conducted at 180° C. for 30 minutes. The conductive plating of the obtained conductive layer had a thickness of about 30 μm, and the peeling strength was 0.8 kgf/cm. The peeling strength was evaluated according to the Japanese Industrial Standards (JIS) C6481. The obtained multilayer printed wiring board was not warped by baking at 255° C.×15 minutes.

Comparative Example 2

After laminating and hot pressing in the same manner as in Example 3, the release PET film was detached, and the resulting laminate was heated at 180° C. for 30 minutes to thermally cure the prepreg therein. Since concaves and convexes (about 3 μm) were developed, along the seam of the glass cloth, on the surface of the resin after thermal curing, the product was not usable for the subsequent evaluation. The resin surface in Example 3 was flat like a support film, and the concaves and convexes on a circuit were about 1 μm and fine. As for the surface flat characteristics, a non-contact type surface roughness meter (WYKO NT3300 manufactured by Veeco Instruments Inc.) was used (VSI contact mode, 10× lens, measurement range 1.2 mm square), and the concaves and convexes were evaluated by Rt value (Peak-to-valley) of the surface of the insulating layer.

Example 4

A 16 μm-thick glass cloth (1027NS manufactured by Arisawa Mfg. Co., Ltd.) was impregnated with the resin varnish obtained in Example 1 and dried at 80 to 120° C. for 6 minutes to give a 50 μm-thick prepreg (residual solvent amount was 1 wt % in the thermosetting resin composition without glass cloth). A 38 μm-thick release PET film (AL5: alkyd resin series release agent manufactured by Lintec Corporation) was thermally laminated from one side of the prepreg and a 16 μm-thick polypropylene protection film was thermally laminated from the other side thereof and the laminate was wound in a roll. Thereafter, the roll was slit at width 335 mm to give a prepreg with a roll-like plastic film. Then, the prepreg with the plastic film was cut in 500 mm length, temporarily fit to both surfaces of a copper-plated laminate plate (510 mm×340 mm size, thickness 0.2 mm) with a circuit formed thereon (circuit conductor thickness 18 μm), laminated on both surfaces by a vacuum laminating machine manufactured by MEIKI Co., Ltd. under conditions of temperature 120° C., pressure 7 kgf/cm$^2$, pressure 5 mmHg or below, and continuously subjected to a hot press with an SUS mirror panel under conditions of temperature 120° C., pressure 5 kgf/cm$^2$. Then, the laminate with a release PET film was thermally cured at 180° C. for 30 minutes to form an insulating layer on both surfaces of the substrate.

Figure 1:
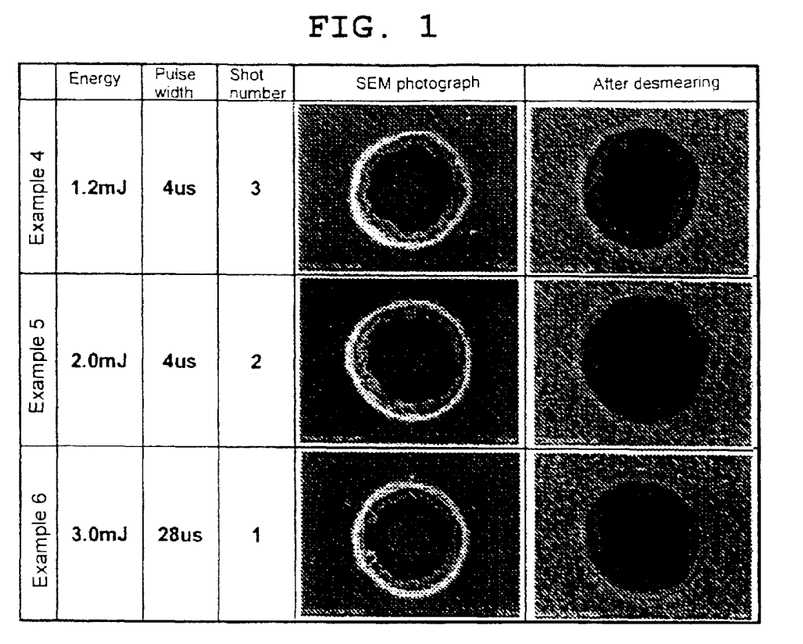
FIG. 1 is a figure containing scanning electron microscope (SEM) photographs showing the results of Examples 4 to 6.

After cooling to room temperature, plural blindvias (assuming top diameter of 70 μm) were formed by applying a carbon dioxide gas laser (ML605GTWII-P) manufactured by Mitsubishi Electric Corporation on the release PET film (without being detached) under the conditions described in FIG. 1, row for Example 4. To adjust the assumed top diameter 70 μm to that in the Comparative Examples, the mask diameter was set to 1.1 mm, which is somewhat larger than 1.0 mm set when pores are formed without a release PET film in the Comparative Examples to be mentioned later.

Thereafter, blindvia was observed with a scanning electron microscope (SEM) (type "SU-1500" manufactured by Hitachi High-Technologies Corporation) and laser processability was evaluated. After a desmear process of the insulating layer also serving as a roughening treatment process, the blindvia was also observed with a scanning electron microscope (SEM). The roughening treatment process was performed by subjecting the laminate to a step of swelling 60·C×5 minutes, oxidation 80·C×20 minutes and neutralization 40·C×5 minutes using a roughening solution manufactured by Atotech (Swelling Dip Securiganth P (swelling), Concentrate Compact P (oxidation), Reduction Solution Securiganth P (neutralization)).

Example 5

By an operation in the same manner as in Example 4 except that pore was formed under the conditions described in FIG. 1, row for Example 5, evaluation was performed in the same manner as in Example 4.

Example 6

By an operation in the same manner as in Example 4 except that pore was formed under the conditions described in FIG. 1, row for Example 6, evaluation was performed in the same manner as in Example 4.

Comparative Examples 3 to 5

Figure 2:
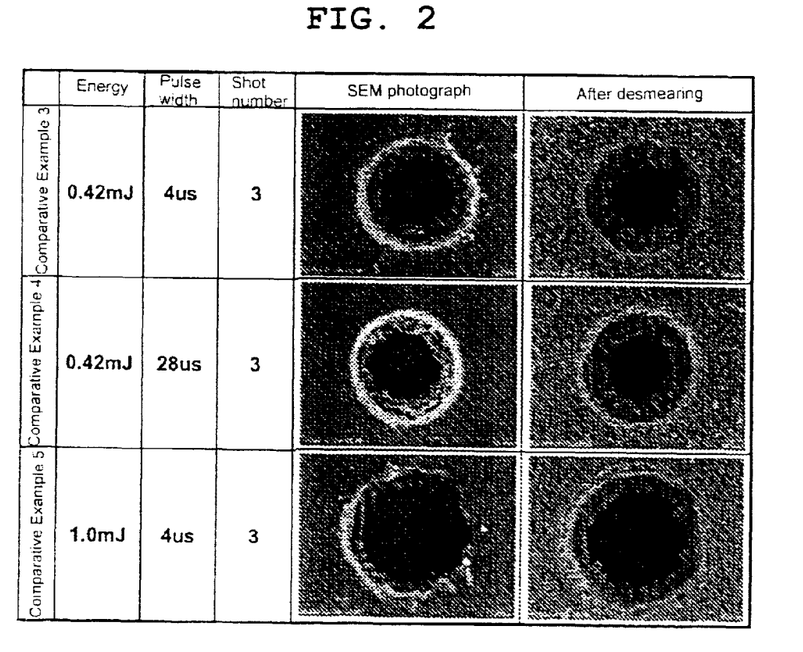
FIG. 2 is a figure containing scanning electron microscope (SEM) photographs showing the results of Comparative Examples 3 to 5.

A circuit board with an insulating layer formed on both surfaces, which was prepared as described in Example 4, was cooled to room temperature, a release PET film was detached, and a pore was formed using carbon dioxide gas laser (ML605GTWII-P) manufactured by Mitsubishi Electric Corporation (mask diameter 1.0 mm) under the conditions described in FIG. 2 (Comparative Examples 3 to 5). Other than that, by an operation in the same manner as in Example 4, evaluation was performed in the same manner as in Example 4.

The results are shown in FIG. 1 and FIG. 2. As SEM photograph, the part with high glass cloth density is representatively shown.

As is clear from FIG. 1, any blindvia formed by applying carbon dioxide gas laser on the support film was superior in the circularity of via, the resin was damaged less even with high energy exceeding 1 mJ, and the insulating layer around the via had a uniform rough surface after desmearing. Moreover, since high energy is used, via processing is possible even when the number of shots is reduced, and it is clear that the method of the present invention is a pore formation method suitable for high-speed formation of via.

On the other hand, it is clear from FIG. 2, wherein a blindvia was formed by directly applying carbon dioxide gas laser to the insulating layer after detachment of the support film, that processability decreased and protrusion of glass cloth became noticeable in Comparative Examples 3 and 4 using low energy. In Comparative Example 5 wherein the energy was comparatively high and 1 mJ, protrusion of glass cloth was comparatively suppressed; however, since the circularity of the via was poor and the resin of the insulating layer surface near the via was highly damaged, the via top diameter expanded remarkably after desmearing.

Where a numerical limit or range is stated herein, the endpoints are included. Also, all values and subranges within a numerical limit or range are specifically included as if explicitly written out.

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A method of producing a multi-layer printed wiring board, comprising:
    (a) conveying an adhesive sheet from an adhesive sheet roll, wherein said adhesive sheet comprises a prepreg formed on a support film and said adhesive sheet is wound in a roll, and placing said adhesive sheet such that a surface of said prepreg contacts one or both of the surfaces of a circuit board;
    (b) partially adhering said adhesive sheet to said circuit board by heating and pressing a part of said adhesive sheet from the support film side, and cutting said adhesive sheet according to the size of said circuit board with a cutter, to obtain a temporarily fitted adhesive sheet;
    (c) heating and pressing said temporarily fitted adhesive sheet under reduced pressure to laminate said adhesive sheet on said circuit board;
    (d) thermally curing said prepreg, to obtain an insulating layer; and
    (e) detaching said support film after said thermally curing,
    wherein, in said adhesive sheet, said support film has a release layer on the surface side in contact with said prepreg, and the peel strength of said support film from said prepreg before thermal curing is not less than 1.5 gf/50 mm at 180-degree peel strength,
    wherein said method further comprises drilling said insulating layer, roughening said insulating layer, to obtain a roughened insulating layer surface, forming a conductive layer on said roughened insulating layer surface by plating, and forming a circuit on said conductive layer, and
    wherein said drilling is performed between said thermally curing said prepreg and said detaching said support film.

2. The method according to claim 1, wherein, in said adhesive sheet, said support film has a thickness of 20 to 50 μm and said prepreg has a thickness of 20 to 100 μm.

3. A method according to claim 1, wherein said placing said adhesive sheet such that a surface of said prepreg contacts one or both of the surfaces of a circuit board and said partially adhering said adhesive sheet to said circuit board are performed by an auto cutter apparatus.

4. The method according to claim 1, wherein said heating and pressing said temporarily fitted adhesive sheet under reduced pressure to laminate said adhesive sheet on said circuit board is performed by a vacuum laminating machine.

5. The method according to claim 1, wherein said adhesive sheet has a layer constitution of protection film/prepreg/support film, and said protection film is detached by winding during said conveying of said adhesive sheet.

6. The method according to claim 5, wherein, in said adhesive sheet, said protection film has a thickness of 5 to 30 μm.

7. The method according to claim 1, wherein said heating and pressing are performed via an elastic material in the laminating step.

8. The method according to claim 7, further comprising, after said heating and pressing said temporarily fitted adhesive sheet under reduced pressure to laminate said adhesive sheet on said circuit board, heating and pressing said adhesive sheet under normal pressure with a metal plate.

9. The method according to claim 1, wherein said drilling comprises forming a via hole by applying a carbon dioxide gas laser on the top of said support film.

10. The method according to claim 9, wherein said carbon dioxide gas laser has an energy of not less than 1 mJ.

11. The method according to claim 9, wherein said energy of said carbon dioxide gas laser is 1 mJ to 5 mJ.

12. The method according to claim 1, wherein said support film is a poly(ethylene terephthalate) film.

13. The method according to claim 1, wherein said prepreg comprises a glass cloth impregnated with a thermosetting resin composition.

* * * * *